United States Patent [19]

Hicks, Jr.

[11] Patent Number: 4,531,811
[45] Date of Patent: Jul. 30, 1985

[54] FIBER OPTICS POLARIZER

[75] Inventor: John W. Hicks, Jr., Sturbridge, Mass.

[73] Assignee: Polaroid Corporation, Cambridge, Mass.

[21] Appl. No.: 504,232

[22] Filed: Jun. 14, 1983

Related U.S. Application Data

[63] Continuation-in-part of Ser. No. 223,599, Jan. 9, 1981, abandoned, which is a continuation-in-part of Ser. No. 21,868, Mar. 19, 1979, Pat. No. 4,315,666.

[51] Int. Cl.³ .............................................. G02B 5/172
[52] U.S. Cl. .............................. 350/96.33; 350/96.15
[58] Field of Search ............... 350/96.15, 96.16, 96.13, 350/96.29, 96.30, 96.33

[56] References Cited

U.S. PATENT DOCUMENTS

| | | | |
|---|---|---|---|
| 3,372,969 | 3/1968 | Snitzer | 350/96.29 X |
| 4,179,189 | 12/1979 | Kaminow et al. | 350/96.33 |
| 4,295,739 | 10/1981 | Meltz et al. | 350/96.33 X |
| 4,315,666 | 2/1982 | Hicks, Jr. | 350/96.15 |

OTHER PUBLICATIONS

Schiffner et al., "Double-Core Single-Mode Optical Fiber as . . . ", *Appl. Phys.*, vol. 23, No. 1, Sep. 1980, pp. 41–45.
Johnson, "In-Line Fiber-Optical Polarization Transformer", *Applied Optics*, vol. 18, No. 9, May 1979, pp. 1288–1289.
Eickhoff, "In-Line Fiber-Optic Polariser", *Electronics Lett.*, vol. 16, No. 20, Sep. 1980, pp. 762–764.
Lefevre, "Single-Mode Fiber Fractional Wave Devices and . . . ", *Electr. Lett.*, vol. 16, No. 20, Sep. 1980, pp. 778–780.
Bergh et al. "Single-Mode Fibre-Optic Polarizer", *Optics Letters*, vol. 5, No. 11, Nov. 1980, pp. 479–481.

*Primary Examiner*—John Lee
*Attorney, Agent, or Firm*—Francis J. Caufield

[57] ABSTRACT

A fiber optics polarizer, wherein a multi-core polarization element is inserted to a fiber communications line and a signal to be communicated through the polarizer is carried by a first core and the other polarizations are coupled from the first core into one or more other cores to prevent propagation through the system.

12 Claims, 14 Drawing Figures

FIBER OPTICS POLARIZER

Application Ser. No. 223,599 filed Jan. 9, 1981, now abandoned, is a continuation-in-part of U.S. application Ser. No. 21,868 filed Mar. 19, 1979, John Wilbur Hicks, Jr., inventor (U.S. Pat. No. 4,315,666).

This invention relates primarily to fiber optics devices and more particularly to such devices for use in a communications system for the purpose of separating by polarization.

Under normal circumstances, it is extremely disadvantageous to use ordinary sheet polarizers in a fiber optics system. The polarizer itself should be a fiber or a fiber-like device so that it is more compatible with a fiber communications system.

The invention and disclosure of parent application Ser. No. 21,868 is useful in terms of its teaching of coupling one fiber core to another in a fiber optics communication system. The basic fiber optics concept involves the propagation, with very little light loss, of light through a core having a higher index of refraction than the medium into which it is imbedded (cladding). In a communications system, the light propagated through the core of the fiber represents transmitable information which it is important to maintain as it propagates through the system. It is frequently desirable to select between the two polarization states. This invention is particularly concerned with the manner and structure for making the choice.

Accordingly, a primary object of the present invention is to provide a polarizer for a fiber optics communications system.

A further and more particular object of the present invention is to provide a polarizer for a fiber optics communications system wherein coupling between fiber cores is used to accomplish the polarization selection.

These and other objects of the present invention are provided in a fiber optics communications system wherein a portion of the communications line comprises a cladding having two cores, the first of which propagates the selected polarization and the other of which propagates or attenuates the other polarization. Each core is selected to operate in the single mode domain and externally applied stress is a preferred means for accomplishing the choice of polarization. Other means for polarization selection involves the use of materials having different coefficients of thermal expansion when secondary or attenuating cores are compared to communications propagation cores. Still another approach involves geometrical shaping to accomplish the polarization selection process. Yet another means for polarization selection involves an asymmetry produced by the choice of index of refraction of the cladding.

Other objects, features and advantages of the present invention will become apparent by the following detailed description of a preferred, but nonetheless illustrative, embodiment of the present invention, with reference to the accompanying drawings, wherein.

There are several uses for polarizers in fiber optics systems. It is awkward and inefficient (in light energy) to couple an ordinary sheet polarizer with a fiber system. Therefore, it would be advantageous to have a polarizer which was itself a fiber and could be spaced onto a fiber easily and with very little light loss.

Figure 1:
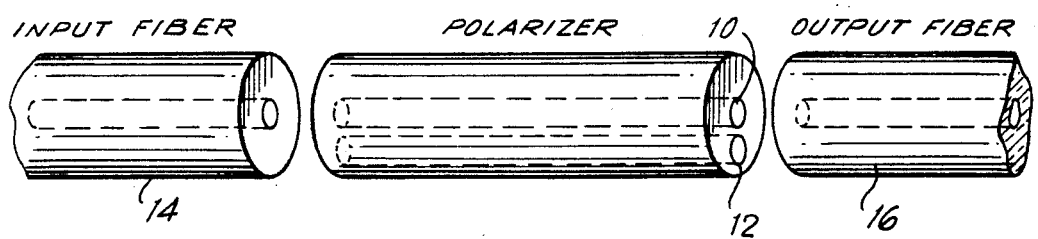
FIG. 1 is a representation of a fiber optics communications line, with a multi core fiber polarizer inserted for performing a polarization selection function.

This invention uses the teachings of my patent application Ser. No. 21,868 to produce such a fiber polarizer. It comprises two cores 10, 12 with weak coupling between them. The control core 10 receives light by butt coupling from an external fiber 14 as shown in FIG. 1. The structure, as shown, delivers a portion of this input light to another fiber 16 by butt coupling. The central core 10 and the second core 12 are operating in the single mode domain. One of the two polarizations of the central core 10 is coupled into the secondary fiber 12 and lost to the system. The other polarization passes through to the output fiber 16 with little attenuation.

When one speaks of "single mode" fiber, the term is not exact. There are always two possible polarizations even in single mode operation. In a circularly symmetric fiber, these two modes are degenerate, which is to say their propagation constants are equal. In the absence of circular symmetry, the two modes will have different propagation constants.

In this invention, there are several possibilities for the achievement of asymmetry. The asymmetry can be in the central core 10, the secondary core 12, or both. The asymmetry can be the result of geometrical shape or of birefringence. Starting with glass as a core material, there is no inherent birefringence, but it can be stress-induced. The stress can be externally applied or built into the fiber.

There is another choice. The light coupled into the secondary fiber will move back and forth cyclically between the two cores 10, 12. The length of the polarizer can be chosen to insure that the rejected polarization light is all in the secondary core 12 at the termination of the polarizer. Another preferred solution is to make the secondary core 12 absorptive so that light in that core will be attenuated. The degree of attenuation should be such that the light intensity falls to 1/e (e=2.72) in one coupling length. This is not critical, but if the attenuation is too great, the coupling process will be somewhat detuned If it is too small, the length required to get adequate polarization contrast will be unnecessarily long. In any case, when attenuation is used, the polarizing fiber device need not be cut to exact length.

Figure 2:
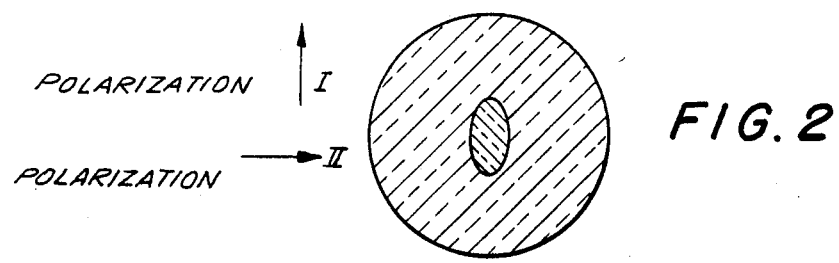
FIG. 2 is a representation of the use of geometrical shaping of the core for producing differences in propagation constants between polarizations, as an alternative embodiment.

One of the main advantages of using this fiber polarizer is the efficiency of coupling and therefore the preferred embodiment uses a centrally located core 10 of numerical aperture matching that of the input fiber 14. Ordinarily, the fiber used for communication has a rather low N.A. in the range of 0.08 to 0.15. In this low N.A. region, it is well known that geometrical shaping does not produce strong differences in propagation constant between polarizations, as shown in FIG. 2.

Figure 3:
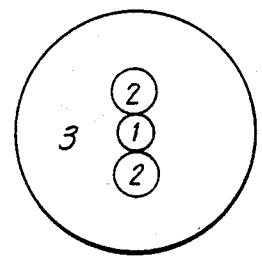
FIG. 3 is another alternative embodiment for producing diferences in polarization by means of the choice of cladding index of refraction with respect to both the propagation core and the cores to which unselected polarizations are transferred.

Yet, oblong distortion will decrease butt coupling efficiency. So, in the preferred embodiment, this approach is rejected. The asymmetry can reside in the index of refraction of the surrounding medium, as shown in FIG. 3.

Let the index of the central core 1 be $n_1$ and let the index of the general cladding 3 be $n_3$, and insert two areas 2 of index $n_2$ lower than $n_3$.

This will produce polarization asymmetry and will produce less coupling inefficiency than the elliptical core.

A third approach is to let the areas designated 2, have a different coefficient of thermal expansion from 1 and 3. In this case, 1 is subjected to an anisotropic (has a preferred direction) stress, either tension or compression, due to the differential contraction as the fiber cools from the drawing process.

Figure 4:
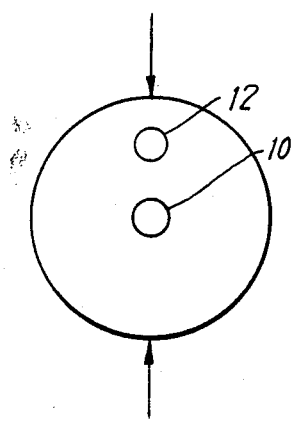
FIG. 4 is a representation of a preferred embodiment for selecting polarization by applying external stress to produce stress birefringence.

A fourth approach is to apply external stress (FIG. 4) to produce stress birefringence. In this case, it is necessary to avoid producing the same stress birefringence in the secondary core 12. This can be accomplished by using different core materials with different stress optical coefficients.

Figure 5:
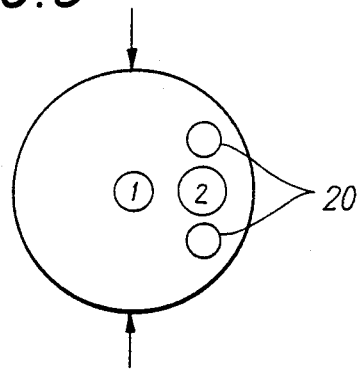
FIG. 5 represents a means for isolating the secondary core from the applied external stress in order to select a polarization.

As an alternative, two holes 20, 20 may be placed near the secondary core to isolate it from the external stress, as shown in FIG. 5.

Figure 6:
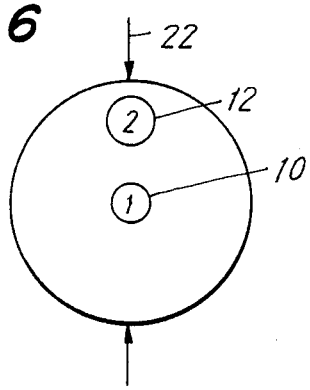
FIG. 6 represents the preferred embodiment for supporting polarization by appling external stress nearest the secondary core.

In a preferred embodiment, we put the bulk of the asymmetry in the secondary core 12 and external stress is chosen as the simplest means (FIG. 6).

Due to its location, the secondary core 12 receives considerably more stress that the central core 10.

The analysis is simplified by stating that the secondary core 12 suffers the full stress and the primary core 10 has none.

Figure 7:
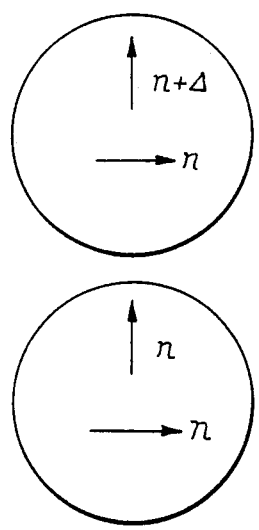
FIG. 7 is a representation showing a fiber polarization according to FIG. 6 and particularly the index of refraction effect produced by applying stress near the secondary core, the two cores being formed with the same material and being of the same diameter.

When the same material and same diameter is used for both cores 10, 12 and the stress produces an index change for the polarization along the stress direction, the treatment is simpler. FIG. 7 shows the index effect for that case.

Figure 8:
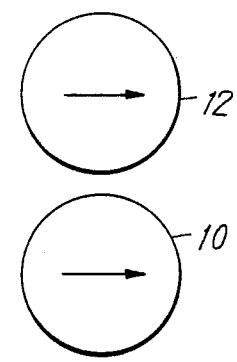
FIG. 8 illustrates the propagation constant being the same in the two cores, thus enabling sufficient lateral coupling between cores.

The modes shown in FIG. 8 will have the same propagation constant and that energy will couple between the central core 10 and the secondary core 12.

Figure 9:
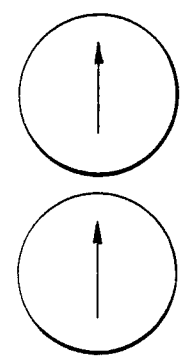
FIG. 9 illustrates a situation wherein the modes differ in propagation constant, leading to incomplete coupling.

The modes of FIG. 9 will differ in propagation constant and will therefore couple incompletely. The degree of coupling can be estimated, as follows:

Assume $\Delta$ is known. A coherence length is defined, where:

$$L_c \Delta = \tfrac{1}{2}\lambda$$

$L_c$ = coherence length.
$\lambda$ = wave length of light being used.
Assume a coupling length of:

$$L_{coup.}$$

If $L_c << L_{coup.}$, then the maximum energy transferred will be:

$$(L_c/L_{coupling})^2$$

Figure 10:
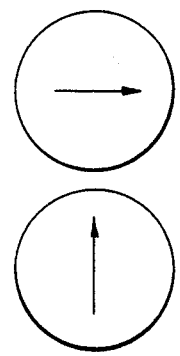
FIG. 10 shows the modes having propagation constants which match, but without leading to coupling because of the orthogonal polarization directions.

For this reason, $L_c/L_{coup}$ should be less than 10%. The modes of FIG. 10 will have matching propagation constants but will be, in theory, not coupled at all and in practice very lightly coupled. Some stress is applied to the central core and some change in index will be produced along the axis perpendicular to the stress. The ratio of major to minor axis index change is typically 2 to 3 for glasses.

Figure 11:
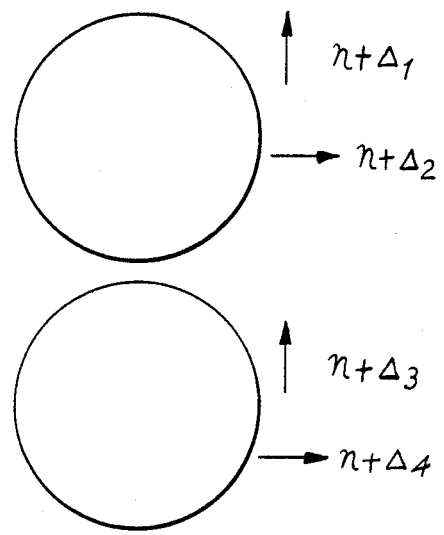
FIG. 11 shows the index of refraction effect caused by stress being applied to the central core with changes in index being produced along the axis perpendicular to the stress, so that $\Delta_1 > \Delta_2 > \Delta_3 > \Delta_4$.

So, actually the effect of FIG. 11 is produced, where $\Delta_1 > \Delta_2 > \Delta_3 > \Delta_4$.

The teachings of application Ser. No. 21,868 are used and the fiber bent in a plane containing the two cores 10, 12. The coupled modes are tuned by experimentally adjusting the radius of the bend until the propagation constants are matched.

Figure 12:
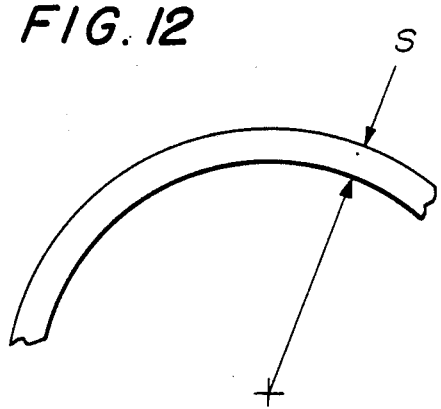
FIG. 12 illustrates the use of fiber bending for tuning the coupled modes, considering path length only and not stress optical coefficient.

Consider the change in path length only and not the change produced by the stress of bending, which is a lesser effect. The FIG. 12 representation will be attained.

Figure 13:
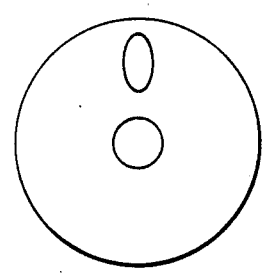
FIG. 13 illustrates a structure where materials of the cores are the same and the area of the secondary core is equal to the area of the primary core, with the ratio of major to minor axis in the secondary core being two to one; and, FIG. 14 is a structure for coupling two cores of the same material, wherein a pressure is applied to the secondary core.

A second preferred embodiment is shown in FIG. 13 where the materials are the same. The ratio of major to minor axis ($d_1$ to $d_2$) is two to one:

$$d_1 = 3.4\mu.$$

Also, the area of the second core is equal to the area of the first core:

$$\lambda\text{cut-off} = 5000\text{Å}$$

Å as before, center to center spacing is $13\mu$ and outer diameter is $40\mu$. Therefore $R(n+\Delta_4)$ must equal $(R+S)(n+\Delta_2)$ where S is the center to center spacing of the two cores. This gives:

$$R = Sn/(\Delta_4 - \Delta_2).$$

This will give a first approximation to R and fine tuning can be accomplished experimentally.

Figure 14:
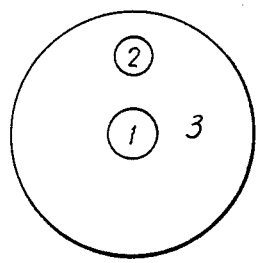

Now, for example, FIG. 14 is a structure, as follows:
$n_1 = 1.522$ Schott K5
$n_2 = 1.522$ Schott K5
$n_3 = 1.518$ Schott K3

$d_1 = d_2 = 3.4\mu$ for a higher mode cut-off of about 5000Å, center to center separation $= 12\mu$, and outer diameter $= 40\mu$.

This produces a coupling length of about 5 to 10 cm. Therefore, enough force must be applied to produce a coherence length of less than 1 cm for the mis-matched polarization direction. This requires a pressure of about 2,000 pounds per square inch at the secondary core which comes to about 2 pounds per inch of fiber length.

Thus, a communications system is provided by means of a fiber optics polarizer which includes a pair of cores for lateral coupling to thereby separate polarizations, one for propagation of the communication and one for attenuation, or otherwise.

The invention as described is to be limited only by the following claims.

What is claimed:

1. A single mode fiber optics polarizer for use in a system, said polarizer comprising a first core, a second core and a cladding, said second core being of a construction to provide differing propagation constants for two polarization states, said first core porpagating a desired polarization and of characteristics to provide lateral coupling of undesired polarization for a predetermined length with said second core.

2. The invention according to claim 1 wherein said system is a communications system.

3. The invention according to claim 1 wherein said construction includes a material subject to a change of propagation characteristics.

4. The invention according to claim 3 wherein said change is determined by the application of external pressure.

5. The invention according to claim 3 wherein said change is determined by bending said construction.

6. The invention according to claim 3 wherein said change is determined by the shape of said construction.

7. The invention according to claim 1 wherein said first and second cores are of matched materials.

8. The invention according to claim 1 wherein said cladding is of a material having different index of refraction characteristics than said cores.

9. The invention according to claim 1 wherein coupling of said cores is established for approximately 5 to 10 cms.

10. A single mode fiber optics polarizer, said polarizer comprising:
at least a pair of cores surrounded by cladding, one of said cores being structured to receive and transmit single mode radiation in two different states of polarization, one of which is desired and the other not desired, said cores and said cladding being further structured and arranged with respect to one another for transfer of said undesired state of polarization from said one core into said other core so that only said desired state of polarization emerges from said one core.

11. The fiber optics polarizer of claim 10 further structured to be responsive to the application of an external stimulus for selectively transferring said undesired polarization state from said one core to said other core.

12. The fiber optics polarizer of claim 11 wherein said stimulus is a pressure.

* * * * *